United States Patent
Yoshizaki

(12) 
(10) Patent No.: US 6,400,177 B1
(45) Date of Patent: Jun. 4, 2002

(54) OUTPUT DRIVER AND METHOD FOR MEETING SPECIFIED OUTPUT IMPEDANCE AND CURRENT CHARACTERISTICS

(75) Inventor: Shoichi Yoshizaki, Sunnyvale, CA (US)

(73) Assignee: Matsushita Electric Industrial Co., Osaka (JP)

( * ) Notice: Subject to any disclaimer, the term of this patent is extended or adjusted under 35 U.S.C. 154(b) by 0 days.

(21) Appl. No.: 09/491,236

(22) Filed: Jan. 25, 2000

(51) Int. Cl.[7] .......................................... H03K 19/0175
(52) U.S. Cl. ............................. 326/30; 326/86; 326/90; 326/83; 327/108; 327/109; 327/170
(58) Field of Search ........................... 326/26, 27, 30, 326/83, 86, 90; 327/108, 109, 170

(56) References Cited

U.S. PATENT DOCUMENTS

| | | | |
|---|---|---|---|
| 5,184,033 A | | 2/1993 | Chiao et al. |
| 5,287,022 A | | 2/1994 | Wilsher |
| 5,479,124 A | | 12/1995 | Pun et al. |
| 5,808,481 A | | 9/1998 | Thompson |
| 5,854,560 A | * | 12/1998 | Chow .............................. 326/27 |
| 5,973,512 A | | 10/1999 | Baker |
| 6,114,895 A | * | 9/2000 | Stephens ........................ 327/391 |
| 6,201,412 B1 | * | 3/2001 | Iwata et al. ..................... 326/83 |
| 6,281,706 B1 | * | 8/2001 | Wert et al. ...................... 326/83 |

* cited by examiner

*Primary Examiner*—Michael Tokar
*Assistant Examiner*—Vibol Tan
(74) *Attorney, Agent, or Firm*—Morrison & Foerster LLP

(57) ABSTRACT

An output driver comprising pull-up and pull-down transistors coupled to a pad, each transistor comprising a first terminal, a second terminal, and a third terminal, the output driver further comprising voltage response circuits coupled to the transistors and to the pad, the voltage response circuits modifying a voltage difference between the first terminal and the second terminal of the transistors in response to a change in a voltage difference between the third terminal and the second terminal of the transistors for maintaining a desirable output current level during transitions of a signal.

18 Claims, 5 Drawing Sheets

OUTPUT DRIVER AND METHOD FOR MEETING SPECIFIED OUTPUT IMPEDANCE AND CURRENT CHARACTERISTICS

TECHNICAL FIELD

The present invention relates generally to output drivers, and in particular to output drivers that must meet specified output impedance and current characteristics.

BACKGROUND ART

Output drivers are well known in the electronic arts. An output driver typically comprises a "pull-up" transistor that is on when the output signal needs to transition from a low to high value and a "pull-down" transistor that is on when the output signal needs to transition from high to low.

FIG. 1 illustrates a typical CMOS output driver 10. Pad 12 is the point of signal output. The term "pad" as used herein simply means the point of signal output and does not have any other more limited meaning. Typically, in an application involving a system bus, e.g. a Universal Serial Bus, the output will be to a cable such as cable 13. A typical cable will present a capacitive load to a signal output at pad 12. Such a load is represented by capacitor 14 which has a capacitance C1. When the signal voltage value at input 11 is high, the voltage value at gate G1-1 of pull-up transistor Ni-i is high, and, due to inverter 15, the voltage value at gate G2-1 of pull-down transistor N2-1 is low. As a result, transistor N1-1 is on, transistor N2-1 is off, and pull-up current ILH flows as shown, charging up capacitive load 14 and driving the voltage at pad 12 to a high value. Conversely, when the signal voltage value at input 11 is low, transistor N1-1 is off and pull-down transistor N2-1 is on. As a result, pull-down current IHL flows draining the charge on the cable and bringing the voltage at pad 12 down to a low level.

In some applications, it is desirable for output drivers to meet particular output impedance and signal transition time characteristics. For example, Revision 1 of the Universal Serial Bus Specification sets forth particular driver requirements. In particular, the output impedance must be between 3 ohms and 15 ohms. Furthermore, the signal transition times (rise time and fall time) must be between 4–20 ns and the high signal voltage must be between 2.8 v–3.6 v. Assuming constant capacitance, and because I=Cdv/dt, the signal transition time and signal voltage requirements effectively set a current requirement. For example, assuming a high voltage of 3.2 v and a transition time of 12 ns (both values in the middle of the USB required range) and assuming C=50 pF, ILH=IHL=50 PF(3.2 v/12 ns)=13.3 mA. However, given the characteristic voltage/current relationship of a CMOS transistor, delivering a desired output current during signal transitions can be difficult.

FIG. 2 shows an example of the possible approximate shapes of the voltage/current curves for a typical NMOS transistor, such as pull-down transistor N2-1 in the output driver 10 of FIG. 1. These curves help illustrate the difficulty of meeting particular output current and impedance requirements. Pull-down transistor N2-1 has three terminals: drain D2-1, source S2-1, and gate G2-1. FIG. 2 shows 3 curves. Each curve illustrates the relationship between the drain-to-source voltage VDS and the drain-to-source current IDS for a given gate-to-source voltage VGS.

In a typical driver circuit, the gate-to-source voltage VGS would be substantially constant at, for example, VGS1. In output driver 10, the pad output voltage at pad 12 is the same as the drain-to-source voltage VDS of the pull-down transistor N2-1. If the ideal output current is IHL=IDS=IDS1, then VGS will typically be set at VGS=VGS1. As illustrated along the VGS1 curve in FIG. 2, the impedance Z=V/I is steadily decreasing as VDS drops toward VDS1. However, once VDS drops below VDS1, the impedance is not decreasing rapidly enough to maintain the current level, and IDS begins to drop below IDS1. For example, when VDS has dropped to VDS2, IDS=IDS2.

For some applications, such as an output driver for use under the USB specification requirement, the output impedance of a driver such as driver 10 will be too high in the regions of low drain-to-source voltage. Thus IDS will drop too low during the signal transition and the signal transition time may be too slow. If the gate-to-source voltage were set at a higher value, such as VGS2, the impedance when VDS=VDS2 would be relatively lower and a higher transition current IDS=IDS1 would be maintained even as the output voltage VDS dropped. However, in a driver such as driver 10 in FIG. 1, VGS cannot be set at VGS2 during the entire transition because when VDS is greater than VDS2, the output transition current will be too high, and USB or other specification requirements might not be met.

FIG. 3 illustrates an earlier driver 30 known in the art for attempting to deal with the problem of maintaining steady current flow during signal transitions. During the low to high transition, pull-up transistors P1-3 and P2-3 turn on at different times. When an input signal first transitions from low to high, P1-3 turns on and pull-up current ILH1 begins to flow, driving up the voltage at pad 32 (pad 32 is attached to cable 33 which is a capacitive load as represented by capacitor 34 having a capacitance C2). As the output voltage at pad 32 increases, the source-to-drain voltage of transistor P1-3 decreases, and eventually pull-up current ILH1 begins to decrease. However, after a delay due to delay circuit D1-3, transistor P2-3 turns on and pull-up current ILH2 begins to flow, and the overall output pull-up current becomes ILH1+ILH2. Conversely, during the high to low transition, pull-down transistors N1-3 and N2-3 are turned on at different times. When an input signal at input 31 first transitions from high to low, pull-down transistor N1-3 turns on and pull-down current IHL1 begins to flow. However, as the voltage at pad 32 decreases, the drain-to-source voltage of transistor N1-3 also begins to drop and eventually, pull-down current IHL1 begins to decrease. After a delay caused by delay circuit D2-3, pull-down transistor N2-3 is turned on and output current IHL2 begins to flow. Thus the overall pull-down current becomes IHL1+IHL2.

This staggering of two pull-up and two pull-down transistors should, in theory, allow relatively steady pull-up and pull-down currents to be maintained during signal transitions. However, implementing delay circuits that deliver the proper amount of delay to obtain desirable results is difficult. Variations in operating parameters cause variations in the delay implemented by delay circuits D1-3 and D2-3. If the delay is too short, then the output impedance is too low at the beginning of a signal transition and the output current will be too high. If the delay is too long, the output impedance will remain too high as the as the signal transition progresses, and the transition output current will be too low, or possibly even drop to zero.

SUMMARY OF THE INVENTION

A present embodiment of the invention provides one or more voltage response circuits that modify a voltage difference between a first terminal and a second terminal of a pull-up or pull-down transistor in response to a change in a voltage difference between a third terminal and the second terminal of the pull-up or pull-down transistor. As a result, the transistor's impedance and current flow may be adjusted to better meet the requirements of particular applications.

DETAILED DESCRIPTION OF THE DRAWINGS

The following description is presented to enable any person skilled in the art to make and use the invention, and is provided in the context of a particular application and its requirements. Various modifications to the embodiments shown will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
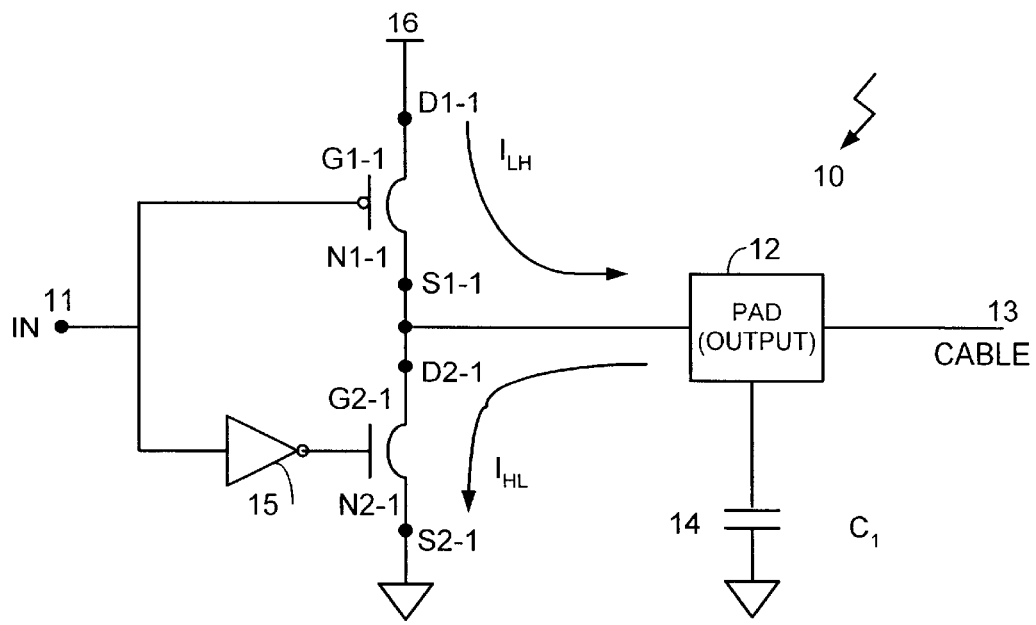
FIG. 1 illustrates an earlier typical output driver.
Figure 2:
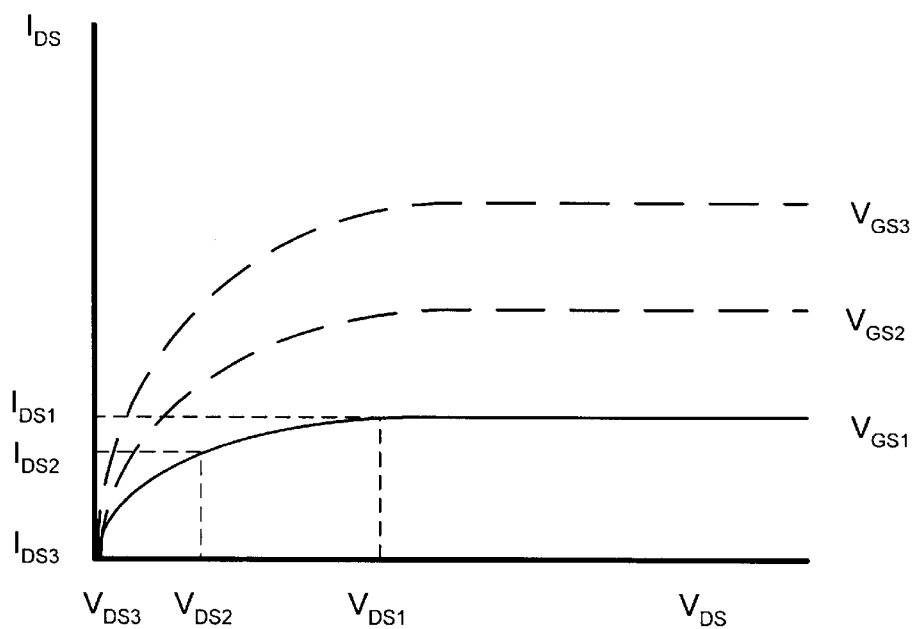
FIG. 2 shows illustrative voltage-current curves characteristic of a typical transistor.
Figure 3:
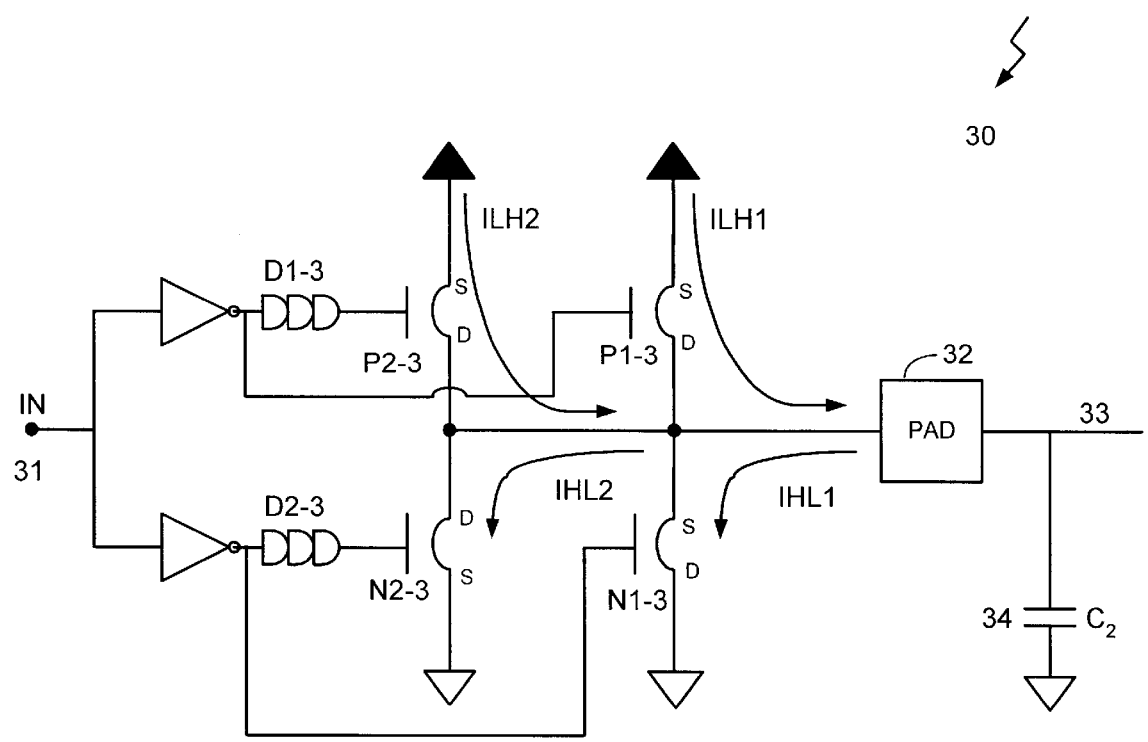
FIG. 3 illustrates another earlier output driver that attempts to solve the problems of output drivers such as the output driver illustrated in FIG. 1.
Figure 4:
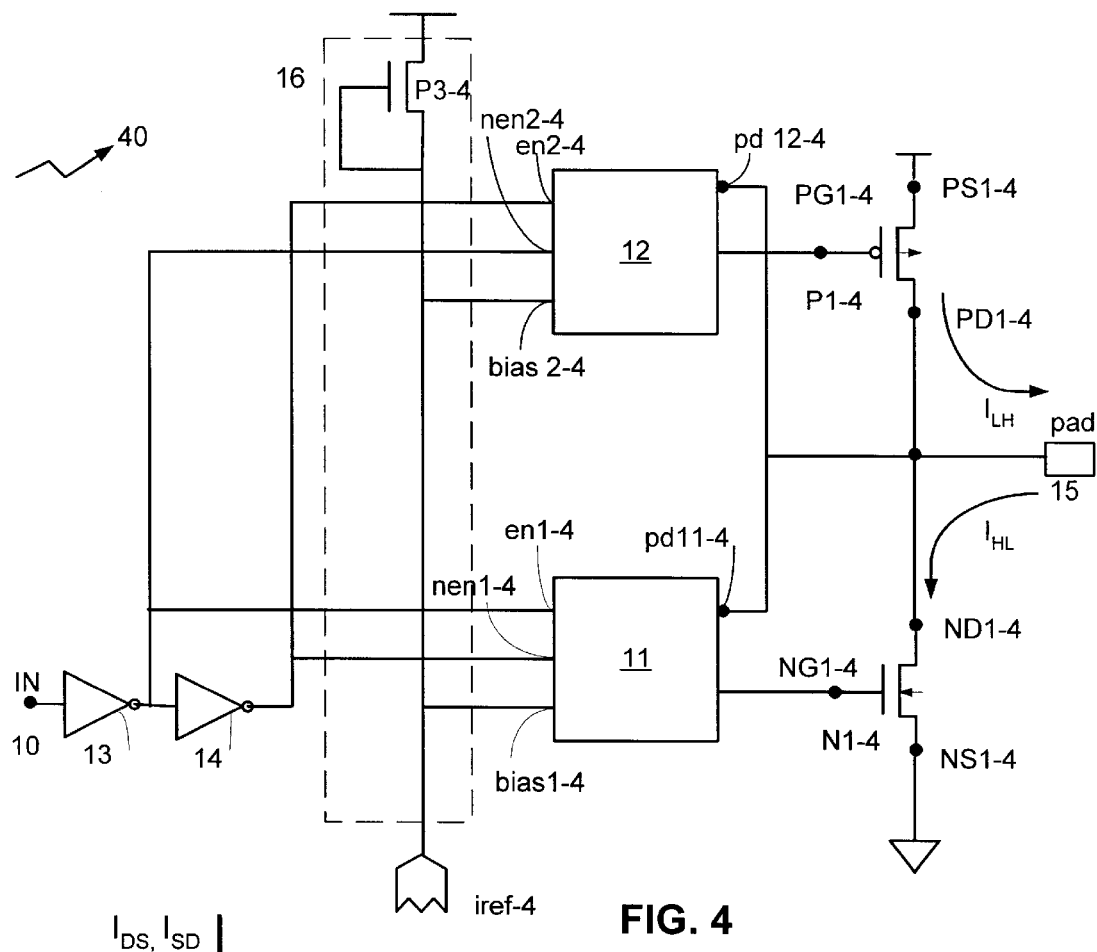
FIG. 4 is a schematic level diagram of a present embodiment of the invention.

FIG. 4 shows a present embodiment of the invention. Output driver 40 comprises input 10, pad (output) 15, pull-up PMOS transistor P1-4, pull-up voltage response circuit 12, pull-down NMOS transistor N 1-4, pull-down voltage response circuit 11, bias 16 (comprising transistor P3-4, and a connection to an external reference current source iref-4), and inverters 13 and 14. Connections to a voltage source are indicated by the upward "T's" and connection to ground is indicated by the downward hollow arrow. As used herein, the term "ground" simply means a point that is closer to zero potential than is the portion of the circuit to which it is coupled. As used herein, the term "pull-up transistor" simply means any transistor that is used to facilitate increasing a voltage level at a driver output. Likewise, the term "pull-down transistor" simply means any transistor that is used to facilitate decreasing a voltage level at a driver output.

Pull-down transistor N1-4 comprises gate NG1-4, drain ND1-4, and source NS1-4. Pull-down voltage response circuit 11 comprises enable terminal en1-4, negative enable terminal nen1-4, terminal bias 1-4 for connection to bias 16, terminal NG11-4 for connection to gate NG1-4, and terminal pd11-4 for connection to pad 15.

Pull-up transistor P1-4 comprises gate PG 1-4, drain PD 1-4, and source PS1-4. Pull-down voltage response circuit 12 comprises enable terminal en2-4, negative enable terminal nen2-4, terminal bias 2-4 for connection to bias 16, terminal PG12-4 for connection to gate PG2-4, and terminal pd12-4 for connection to pad 15.

When the voltage at input 10 switches from high to low, pull-up voltage response circuit 12 becomes negative enabled and pull-up transistor P1-4 turns off while pull-down voltage response circuit 11 becomes enabled and pull-down transistor N1-4 turns on. In the present embodiment, an element internal to voltage response circuit 11 (see FIG. 6 and accompanying description) acts in conjunction with inverters 13 and 14 to provide a switch that enables the pull-down voltage response circuit 11 and the pull-down transistor N1-4 during a high-to-low transition of a signal and negative enables circuit 11 and transistor N1-4 during a low-to-high transition of the signal. Other embodiment may use different switches and may present such switches as either internal or external to voltage response circuit 11. During the high to low transition, current IHL flows from pad 15 through transistor N1-4. As current IHL flows, the voltage at pad 15 and therefore the voltage between transistor drain ND1-4 and transistor source NS1-4 begins to drop. Voltage response circuit 11 is responsive to this drop in pad output and drain-to-source voltage. In response to this voltage drop, voltage response circuit 11 increases the voltage at transistor gate NG1-4. Since this increases the gate-to-source voltage of transistor N1-4, it also reduces the impedance for current flow between drain ND1-4 and source NS1-4. This allows more current flow through transistor N1-4 at lower drain-to-source voltages than would otherwise be possible if the voltage at gate N1-4 had not increased.

Conversely, when the voltage at input 10 switches from low to high, pull-down voltage response circuit 11 becomes not enabled and pull-down transistor N1-4 turns off while pull-up voltage response circuit 12 becomes enabled and pull-up transistor P1-4 turns on. In the present embodiment, an element internal to voltage response circuit 12 (see FIG. 7 and accompanying description) acts in conjunction with inverters 13 and 14 to provide a switch that enables the pull-up voltage response circuit 12 and the pull-up transistor P1-4 during a low-to-high transition of a signal and negative enables circuit 12 and transistor P1-4 during a high-to-low transition of the signal. Other embodiment may use different switches and may present such switches as either internal or external to voltage response circuit 12. During the low to high transition, current ILH flows through transistor P1-4 to pad 15. As current ILH flows, the voltage at pad 15 rises. However, as the voltage at pad 15 rises, the source-to-drain voltage of transistor P1-4 (which equals the difference between the voltage at source PS1-2, minus the output voltage) necessarily begins to drop. Transistor P1-4 is "on" when the voltage at gate PG1-4 is less than the voltage at source PS1-4. Thus, at the beginning of the low-to-high transition, the voltage delivered to PG1-4 is low enough for current ILH to flow. At the beginning of the low-to-high transition, the source-to-drain voltage difference of pull-up transistor P1-4 is relatively high since the voltage at pad 15 is still low. However, as the voltage at pad 15 rises, the source-to-drain voltage of pull-up transistor P1-4 will eventually decrease to a level at which the impedance through that transistor will not allow ILH to be maintained at a desirable level. Voltage response circuit 12 addresses this problem by decreasing (i.e. making either less positive or more negative) the voltage at gate PG1-4 (which increases the voltage difference between gate PG1-4 and source PS1-4) as the output pad voltage increases and the source-to-drain voltage of P1-4 decreases. This allows more current flow through transistor P1-4 at lower source-to-drain voltages than would otherwise be possible if the voltage at gate PG2-4 did not decrease.

Note that output driver 40 is just one example of a circuit configuration in accordance with the present invention. Those skilled in the art will appreciate that the configuration shown in FIG. 4 might be varied without departing from the spirit and principles of the present invention. To note just one example of how driver 40 might be varied, PMOS pull-up transistor might be replaced by an NMOS transistor with a gate connected to a pull-up voltage response circuit, a drain connected to a voltage source, and a source connected to both a pad and the voltage response circuit. In such a variation, the voltage response circuit would have to be reconfigured so that it would increase rather than decrease the voltage level delivered to the gate in response to an increase in the voltage at the pad.

Figure 5:
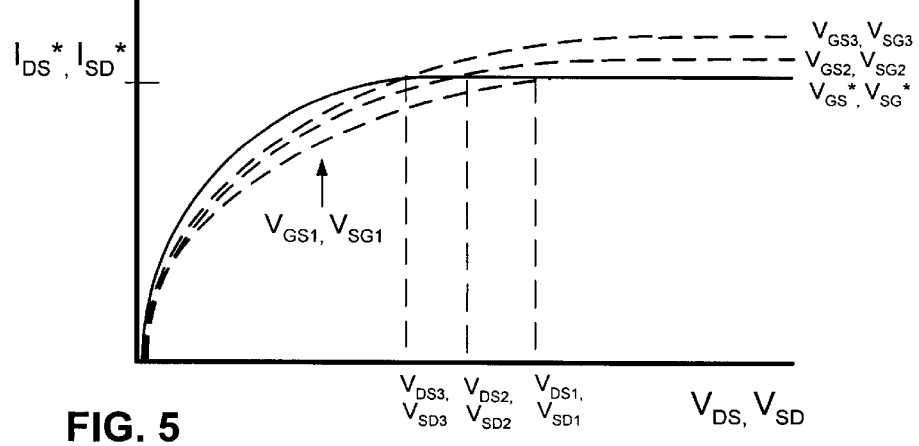
FIG. 5 shows illustrative voltage-current curves to help show the desirable characteristics obtained by operating the pull-down or pull-up transistors of FIG. 4 in conjunction with, respectively, the pull-down or pull-up voltage response circuits of FIG. 4.

FIG. 5 shows illustrative voltage-current curves to help show the desirable characteristics obtained by operating the pull-down and pull-up transistors of FIG. 4 in conjunction with, respectively, the pull-down and pull-up voltage response circuits of FIG. 4.

Pull-down transistor N1-4 of FIG. 4 is an NMOS transistor. For an NMOS transistor, FIG. 5 shows the relevant relationships between drain-to-source current IDS, drain-to-source voltage VDS, and gate-to-source voltage VGS. When the drain-to-source voltage of pull-down transistor N1-4 is at or above VDS1, the gate to source voltage, VGS* is at or near VGS1, and thus the 20 pull-down current IHL is steady at IDS*. However, once the drain-to-source voltage begins to drop below VDS1, the pull-down current would begin to drop below IDS* if the gate-to-source voltage remained at VGS1. However, due to pull-down voltage response circuit 11, as the drain to source voltage of pull-down transistor N1-4 drops below VDS1, VGS* begins to increase in order to maintain the pull-down current IHL near IDS*. As illustrated, by the time VDS has fallen to VDS2, pull-down voltage response circuit 11 has increased VGS* to VGS2 and the pull-down current is still at IDS*. When VDS has fallen to VDS3, the pull-down current may still be maintained at IDS* because VGS* has increased to VGS3.

Pull-up transistor P1-4 of FIG. 4 is a PMOS transistor. For a PMOS transistor, FIG. 5 shows the relevant relationships between source-to-drain current ISD, source-to-drain voltage VSD, and source-to-gate voltage VSG. When the source-to-drain voltage of pull-up transistor P1-4 is at or above VSD1, the source-to-gate voltage, VSG* is at or near VSG1, and thus the pull-up current ILH is steady at ISD*. However, once the source-to-drain voltage begins to drop below VSD1, the pull-up current would begin to drop below ISD* if the source-to-gate voltage remained at VSG1. However, due to pull-up voltage response circuit 12, as the source-to-drain voltage of pull-up transistor P1-4 drops below VSD1, VSG* begins to increase in order to maintain the pull-up current ILH near ISD*. As illustrated, by the time VSD has fallen to VSD2, pull-up voltage response circuit 12 has increased VSG* to VSG2 and the pull-up current is still at ISD*. When VSD has fallen to VSD3, the pull-down current may still be maintained at ISD* because VSD* has increased to VSG3.

Figure 6:
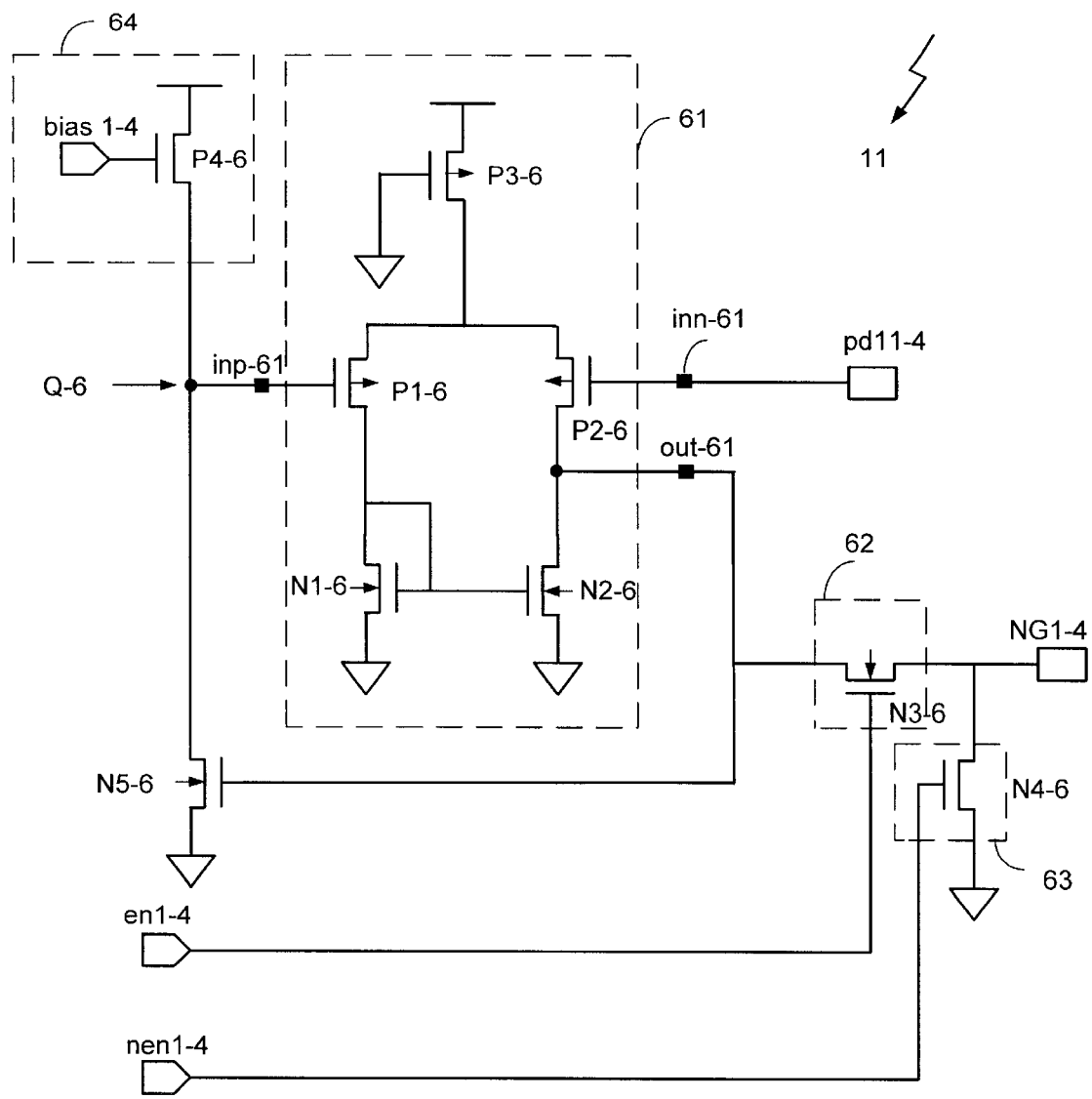
FIG. 6 is a transistor level diagram of the pull-down voltage response circuit of FIG. 4.

FIG. 6 is a transistor level diagram of the pull-down voltage response circuit 11 of the embodiment depicted in FIG. 4. Those skilled in the art will recognize that the circuit illustrated in FIG. 6 is just one example of a voltage response circuit that might be implemented in accordance with the present invention. Pull-down voltage response circuit 11 comprises op-amp 61 (comprising transistors P1-6, P2-6, P3-6, N1-6, and N2-6), switches 62 (comprising transistor N3-6) and 63 (comprising transistor N4-6), current source 64 (comprising transistor P4-6 coupled to bias 16 at terminal bias 1-4) and feedback transistor N5-6. Connections to a voltage source are indicated by the upward "T's" and connections to ground are indicated by the downward hollow arrows.

When the voltage at terminal en1-4 is high and the voltage a terminal nen1-4 is low, transistor N3-6 is on, transistor N4-6 is off, and a voltage is delivered at terminal NG 1-4 to the gate of transistor N1-4 shown in FIG. 4. Conversely, when the voltage at terminal en1-4 is low and the voltage at terminal nen1-4 is high, transistor N3-6 is off, transistor N4-6 is on, and little or no voltage is delivered at terminal NG1-4 to the gate of transistor N1-4.

Op-amp 61 has positive input inp-61, negative inn-61, and output out-61. The output at out-61 is responsive to differences between voltage at inn-61 and the voltage at inp-61. Positive input inp-61 is coupled to feedback-sensitive voltage reference node Q-6. A reference voltage is established at node Q-6 by current source 64. However, that reference voltage adjusts based on feedback from output out-61 through feedback transistor N5-6. Negative input inn-61 is connected to pad 15 at terminal pd11-4. Thus, when the voltage at pad 15 begins to drop, the voltage at inn-61 will begin to drop below the voltage at inp-61. In response, the voltage at OUT-61 will increase, thereby increasing the voltage delivered to gate NG1-4 of pull-down transistor and allowing current IHL to remain at a sufficiently steady level as the output voltage at pad 15 decreases.

Figure 7:
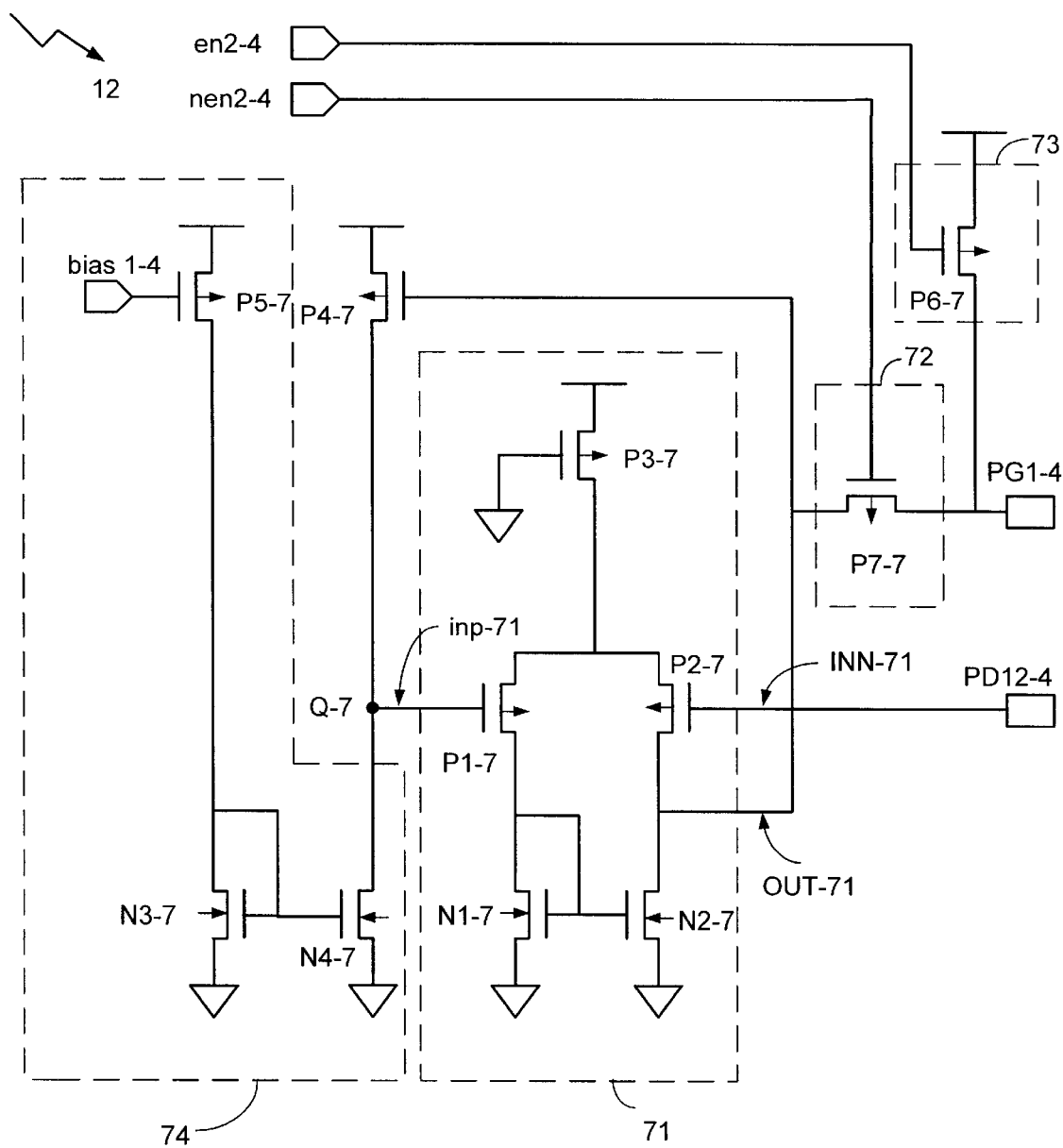
FIG. 7 is a transistor level diagram of the pull-up voltage response circuit of FIG. 4.

FIG. 7 is a transistor level diagram of pull-up voltage response circuit 12. Those skilled in the art will recognize that the circuit illustrated in FIG. 7 is just one example of a voltage response circuit that might be implemented in accordance with the present invention. Pull-up voltage response circuit 12 comprises op-amp 71 (comprising transistors P1-7, P2-7, P3-7, N1-7, and N2-7), switches 72 (comprising transistor P7-7) and 73 (comprising transistor P6-7), current sink 74 (comprising transistor P5-7 coupled to bias 16 at terminal bias 1-4 and current-mirror transistors N3-7 and N4-7) and feed-back transistor P4-7. Connections to a voltage source are indicated by the upward "T's" and connections to ground are indicated by the downward hollow arrows.

Circuit 12 is enabled when the voltage at terminal en2-4 is high and the voltage a terminal nen1-4 is low. In the enabled mode, transistor P6-7 is off, transistor P7-7 is on, and a low voltage is delivered at terminal PG1-4 to the gate of transistor P1-4 shown in FIG. 4. Conversely, circuit 12 is disabled (negative enabled) when the voltage at terminal en2-4 is low and the voltage at terminal nen2-4 is high. In the negative enabled mode, transistor P7-7 is off, transistor P6-7 is on, and a high voltage is delivered at terminal PG1-4 to the gate of pull-up transistor P1-4.

Op-amp 71 has positive input inp-71, negative input inn-71, and output out-71. The output at out-71 is responsive to differences between the voltage level at negative input inn-71 and the voltage at positive input inp-71. Positive input inp-71 is coupled to feedback-sensitive voltage reference node Q-7. A reference voltage is established at node Q-7 by current sink 74. However, that reference voltage adjusts based on feedback from output out-71 through feedback transistor P4-7. Negative input inn-71 is connected to pad 15 at terminal pd12-4. Thus, when the voltage at pad 15 begins to rise, the voltage at inn-71 will begin to rise above the voltage at inp-71. In response, the voltage at out-71 will decrease, thereby decreasing (i.e. making less positive or more negative) the voltage delivered to gate PG1-4 of pull-up transistor P1-4. Because source PS1-4 of transistor P2-4 is coupled to a voltage source as shown and because the voltage level at gate PG1-4 will generally be lower that the voltage level of the voltage source, decreasing the voltage level at gate PG-4 actually increases the voltage difference between gate PG1-4 and source PS1-4, and thus the flow of pull-up current ILH is facilitated even as the voltage at pad 15 increases.

While particular embodiments of the invention have been described in detail, various modifications to these embodiments can be made without departing from the spirit and scope of the invention. Thus, the invention is limited only by the appended claims.

What is claimed:

1. An output driver comprising:
   a pull-up transistor coupled to a pad and to a voltage source, the pull-up transistor comprising a first terminal, a second terminal, and a third terminal;
   a first voltage response circuit coupled to the pull-up transistor and to the pad, the first voltage response circuit modifying a voltage difference between the first terminal and the second terminal of the pull-up transistor in response to a change in a voltage difference between the third terminal and the second terminal of the pull-up transistor for restraining a decline of an output current level during a low-to-high transition of a signal;
   a pull-down transistor coupled to the pad and to a ground, the pull-down transistor comprising a first terminal, a second terminal, and a third terminal;
   a second voltage response circuit coupled to the pull-down transistor and to the pad, the second voltage response circuit modifying a voltage difference between the first terminal and the second terminal of the pull-down transistor in response to a change in a voltage difference between the third terminal and the second terminal of the pull-down transistor for restraining a decline of an output current level during a high-to-low transition of the signal;
   a first switch coupled to an input terminal and to the first voltage response circuit for enabling the first voltage response circuit and the pull-up transistor during the low-to-high transition of the signal; and
   a second switch coupled to the input terminal and to the second voltage response circuit for enabling the second voltage response circuit and the pull-down transistor during the high-to-low transition of the signal.

2. The output driver of claim 1 wherein the first terminal of the pull-up transistor is a gate coupled to the first voltage response circuit, the second terminal of the pull-up transistor is a drain coupled to the first voltage response circuit and to the pad, and the third terminal of the pull-up transistor is a source coupled to the voltage source.

3. The output driver of claim 2 wherein the first terminal of the pull-down transistor is a gate coupled to the second voltage response circuit, the second terminal of the pull-down transistor is a drain coupled to the second voltage response circuit and to the pad, and the third terminal of the pull-up transistor is a source coupled to the ground.

4. The output driver of claim 1 wherein the first voltage response circuit comprises a first op-amp comprising a positive input coupled to a first feedback-sensitive voltage reference node, a negative input coupled to the pad, and an output coupled to the first terminal of the pull-up transistor and to the first feedback-sensitive voltage reference node.

5. The output driver of claim 2 wherein the first voltage response circuit comprises a first op-amp comprising a positive input coupled to a first feedback-sensitive voltage reference node, a negative input coupled to the pad, and an output coupled to the gate of the pull-up transistor and to the first feedback sensitive voltage reference node.

6. The output driver of claim 3 wherein the first voltage response circuit comprises a first op-amp comprising a positive input coupled to a first feedback-sensitive voltage reference node, a negative input coupled to the pad, and an output coupled to the gate of the pull-up transistor and to the first feedback-sensitive voltage reference node.

7. The output driver of any of claims 1–6 wherein the second voltage response circuit comprises a second op-amp comprising a positive input coupled to a second feedback sensitive voltage reference node, a negative input coupled to the pad, and an output coupled to the first terminal of the pull-down transistor and to the second feedback sensitive voltage reference node.

8. A method for driving a signal, the signal having a low-to-high and a high-to-low transition, the method comprising:
   providing an output driver comprising a pull-up transistor coupled to a driver input, to a driver pad, and to a voltage source and further comprising a pull-down transistor coupled to the driver input, to the driver pad, and to a ground;
   providing the signal to the driver input;
   enabling the pull-up transistor during the low-to-high transition of the signal;
   modifying a voltage difference between a first terminal and a second terminal of the pull-up transistor during the low-to-high transition in response to a change in a voltage difference between a third terminal and the second terminal of the pull-up transistor for restraining a decline of an output current level at the pad during the low-to-high transition;
   enabling the pull-down transistor during the high-to-low transition;
   modifying a voltage difference between a first terminal and a second terminal of the pull-down transistor during the high-to-low transistor in response to a change in a voltage difference between a third terminal and the second terminal of the pull-down transistor restraining a decline of an output current level at the pad during the high-to-low transition.

9. The method of claim 8 wherein the first terminal of the pull-up transistor is a gate coupled to the first voltage response circuit, the second terminal of the pull-up transistor is a drain coupled to the driver pad, the third terminal of the of the pull-up transistor is a source coupled to the voltage source, the first terminal of the pull-down transistor is a gate coupled to the second voltage response circuit, the second terminal of the pull-down transistor is a drain coupled to the second voltage response circuit and to the driver pad, and the third terminal of the pull-down transistor is a source coupled to the ground.

10. The method of claim 8 wherein the step of modifying the voltage difference between the first terminal and the second terminal of the pull-up transistor during the low-to-high transition is accomplished by providing a first op-amp comprising a positive input coupled to a first feedback sensitive voltage reference node, a negative input coupled to the driver pad, and an output coupled to the first feedback-sensitive voltage reference node and to the first terminal of the pull-up transistor.

11. The method of claim 9 wherein the step of modifying the voltage difference between the first terminal and the second terminal of the pull-up transistor during the low-to-high transition is accomplished by providing a first op-amp comprising a positive input coupled to a first feedback sensitive voltage reference node, a negative input coupled to the driver pad, and an output coupled to the first feedback-sensitive voltage reference node and to the gate of the pull-up transistor.

12. The method of any of claims 8–11 wherein the step of modifying a voltage difference between a first terminal and a second terminal of the pull-down transistor during the high-to low transition is accomplished by providing a second op-amp comprising a positive input coupled to a second feedback-sensitive voltage reference node, a negative input coupled to the driver pad, and an output coupled to the second feedback-sensitive voltage reference node and to the first terminal of the pull-down transistor.

13. An output driver comprising:
   a first means for driving a low-to-high transition of a signal, the first means being coupled to a driver input and to a pad;
   a second means for driving a high-to-low transition of the signal, the second means being coupled to the driver input and to the pad; and
   a third means coupled to the first means for restraining a decline of an output current level during the low-to-high transition of the signal.

14. The output driver of claim 13 further comprising a fourth means coupled to the second means for restraining a decline of an output current level during the high-to-low transition of the signal.

15. The output driver of claim 13 wherein the first means comprises a pull-up transistor coupled to a voltage source, the third means being coupled to the pull-up transistor for modifying a voltage difference between a first terminal and a second terminal of the pull-up transistor in response to a change in a voltage difference between a third terminal and the second terminal of the pull-up transistor.

16. The output driver of claim 14 or claim 15 wherein the second means comprises a pull-down transistor coupled to a ground, the fourth means being coupled to the pull-down transistor for modifying a voltage difference between a first terminal and a second terminal of the pull-down transistor in response to a change in a voltage difference between a third terminal and the second terminal of the pull-down transistor.

17. An output driver comprising:
   a pull-up transistor coupled to a pad and to a voltage source, the pull-up transistor comprising a first terminal, a second terminal, and a third terminal;
   a first voltage response circuit coupled to the pull-up transistor and to the pad, the first voltage response circuit increasing a voltage difference between the first terminal and the second terminal of the pull-up transistor when a voltage difference between the third terminal and the second terminal of the pull-up transistor decreases during a low-to-high transition of a signal;
   a pull-down transistor coupled to the pad and to a ground, the pull-down transistor comprising a first terminal, a second terminal, and a third terminal;
   a second voltage response circuit coupled to the pull-down transistor. and to the pad, the second voltage response circuit increasing a voltage difference between the first terminal and the second terminal of the pull-down transistor when a voltage difference between the third terminal and the second terminal of the pull-down transistor decreases during a high-to-low transition of the signal.

18. An output driver comprising:
   a pull-up transistor coupled to a pad and to a voltage source, the pull-up transistor comprising a first terminal, a second terminal, and a third terminal;
   a first voltage response circuit coupled to the pull-up transistor and to the pad, the first voltage response circuit decreasing a voltage at the first terminal of the pull-up transistor when a voltage difference between the third terminal and the second terminal of the pull-up transistor decreases during a low-to-high transition of a signal;
   a pull-down transistor coupled to the pad and to a ground, the pull-down transistor comprising a first terminal, a second terminal, and a third terminal;
   a second voltage response circuit coupled to the pull-down transistor and to the pad, the second voltage response circuit increasing a voltage at the first terminal of the pull-down transistor when a voltage difference between the third terminal and the second terminal of the pull-down transistor decreases during a high-to-low transition of the signal.

\* \* \* \* \*